(12) United States Patent
Chen

(10) Patent No.: US 7,608,894 B2
(45) Date of Patent: Oct. 27, 2009

(54) ELECTROSTATIC DISCHARGE PROTECTION DEVICE

(75) Inventor: Te-Wei Chen, Chu-Pei (TW)

(73) Assignees: Silicon Motion, Inc. (CN), Shenzhen, Guangdong (CN); Silicon Motion, Inc. (TW), Jhubei, Hsinchu County (TW)

( * ) Notice: Subject to any disclaimer, the term of this patent is extended or adjusted under 35 U.S.C. 154(b) by 67 days.

(21) Appl. No.: 11/724,194

(22) Filed: Mar. 15, 2007

(65) Prior Publication Data

US 2008/0073720 A1 Mar. 27, 2008

(30) Foreign Application Priority Data

Sep. 27, 2006 (TW) .............................. 95135789 A

(51) Int. Cl.
*H01L 23/62* (2006.01)
(52) U.S. Cl. .............................. 257/355; 361/57; 361/56
(58) Field of Classification Search ................. 257/355; 361/56, 57
See application file for complete search history.

(56) References Cited

U.S. PATENT DOCUMENTS

| | | | |
|---|---|---|---|
| 5,811,857 A * | 9/1998 | Assaderaghi et al. ........ | 257/355 |
| 6,373,104 B1 * | 4/2002 | Smith .......................... | 257/355 |
| 6,492,686 B1 * | 12/2002 | Pappert et al. .............. | 257/355 |
| 7,420,250 B2 * | 9/2008 | Lee et al. .................... | 257/355 |
| 7,485,930 B2 * | 2/2009 | Lee et al. .................... | 257/355 |
| 2004/0141268 A1 * | 7/2004 | Miller et al. ................. | 361/56 |

* cited by examiner

*Primary Examiner*—Victor A Mandala
(74) *Attorney, Agent, or Firm*—Birch, Stewart, Kolasch & Birch, LLP

(57) ABSTRACT

An electrostatic discharge (ESD) protection device for providing an ESD path between two circuitries is provided. Each circuitry has a power supply terminal and a ground terminal. The protection device comprises an equivalent MOS, a first terminal, and a second terminal. The equivalent MOS comprises a source, a drain and a gate, wherein the drain is connected to the gate. The first terminal is connected to the gate, while the second terminal is connected to the source. The first terminal is connected to one power supply terminal and ground terminal, whereas the second terminal is connected to the other the power supply terminal and ground terminal.

4 Claims, 5 Drawing Sheets

ELECTROSTATIC DISCHARGE PROTECTION DEVICE

This application claims priority to Taiwan Patent Application No. 095135789 filed on Sep. 27, 2006, the disclosures of which are incorporated by reference herein in their entirety.

CROSS-REFERENCES TO RELATED APPLICATIONS

Not applicable.

BACKGROUND OF THE INVENTION

1. Field of the Invention

The present invention relates to an electrostatic discharge protection device. More particularly, the present invention relates to an electrostatic discharge protection device for providing an electrostatic discharge path between two circuitries.

2. Descriptions of the Related Art

An electrostatic discharge phenomenon releases energy to a circuitry, causing a temporarily high voltage and current in the circuitry. This high voltage and current may damage the circuitry in a chip. For example, it may damage internal circuits, or the internal conducting wire. Thus, it is important to provide a non-damaging electrostatic discharge path between internal circuits.

Conventional solutions have placed power cut cells between two internal circuits. The power cut cell is generally a power cut diode combination comprising two power cut diode modules configured to conduct in contrary directions. The combination can be set between two power supply terminals or two ground terminals, as shown in FIG. 1.

FIG. 1 shows two power cut diode combinations 11, 12. The power cut diode combination 11 connects power supply terminals VCC1 and VCC2, while the power cut diode combination 12 connects ground terminals GND1 and GND2. The power cut diode combination 11 comprises two power cut diode modules 111 and 112 configured to conduct in contrary directions. In addition, the power cut diode combination 12 comprises two power cut diode modules 121 and 122 configured to conduct in contrary directions. The power supply terminals and ground terminals respectively connect with the electrostatic discharge (ESD) protection device (not shown in FIG. 1) for conducting ESD energy out of the circuitry. Meanwhile, the turn-on voltage of the diode can block noise flowing between the two internal circuits when the power cut diode is not turned on.

The operations of the power cut diode combinations 11, 12 are described as follows. When an ESD phenomenon occurs on the VCC1, a temporary high voltage occurs. At this time, an ESD protection device connected to the VCC1 forces the ESD energy out of the circuitry. In addition, the power cut diode module 111 guides the ESD energy to the VCC2, so an ESD protection device connected to the VCC2 can force the ESD energy out of the circuitry jointly. By the same principle, when the ESD phenomenon occurs on the VCC2, the power cut diode module 112 can guide the ESD energy to the VCC1. The power cut diode combination 12 operates in a similar way and forces the ESD energy out of the circuitry.

The equivalent model of a diode can be simply realized as combination of an ideal diode and an internal resistor in series, as shown in FIG. 2. FIG. 2 shows an ideal diode 21 and an internal resistor 22 in series, where the ideal diode 22 has an input 211 and an output 212. The ideal diode 21 is presumed to have a threshold voltage without an internal resistor. When the differential voltage caused by the input 211 and the output 212 is higher than the threshold voltage, the ideal diode 21 turns on, and the current flows through the internal resistor 22 and out the output 212. Thus, when the electrostatic discharge energy turns on the ideal diode 21, a voltage is produced by the two ends of the internal resistor 22 due to the flowing current. As a result, the electrostatic discharge energy is more or less blocked by the internal resistor 22. However, there are drawbacks of applying a combination of power cut diodes as a power cut cell.

The aforementioned drawbacks would diminish electrostatic discharge protection. However, conventional technology is not capable of providing a power cut cell that has a low internal resistor when it turns on, and blocks the noise when it turns off.

Therefore, an electrostatic discharge protection device with a low internal resistor and a noise blocking ability is needed in the semiconductor industry.

SUMMARY OF THE INVENTION

The primary objective of this invention is to provide an electrostatic discharge protection device to provide an electrostatic discharge path between two circuits, with each of the circuits having a power supply terminal and a ground terminal. The electrostatic discharge protection device comprises an equivalent MOS with a source, a drain and a gate, the drain connecting to the gate, a first end connecting to the gate, and a second end connecting to the source. The first end connects to the power supply terminal and ground terminal of one circuit. The second end connects to the power supply terminal and ground terminal of the other circuit, respectively.

Another objective of this invention is to provide an electrostatic discharge protection device array to provide an electrostatic discharge path between two circuits. The electrostatic discharge protection device array comprises a first end, a second end, and a plurality of equivalent MOSs in series, with each equivalent MOS having a source, a drain, and a gate. The plurality of equivalent MOSs has a first equivalent MOS and a last equivalent MOS. The first end connects to a gate of the first equivalent MOS, and the second end connects to a source of the last equivalent MOS. Each MOS has its drain connecting to its gate, while each source of the MOS connects to the gate of the next MOS. The first end connects to a power supply terminal and a ground terminal of one circuit. The second end connects to a power supply terminal and a ground terminal of another circuit, respectively.

Thus, the invention provides an ESD protection device with a low internal resistor, and the turn-on voltage of the ESD protection device blocks noise from getting into the circuitry.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
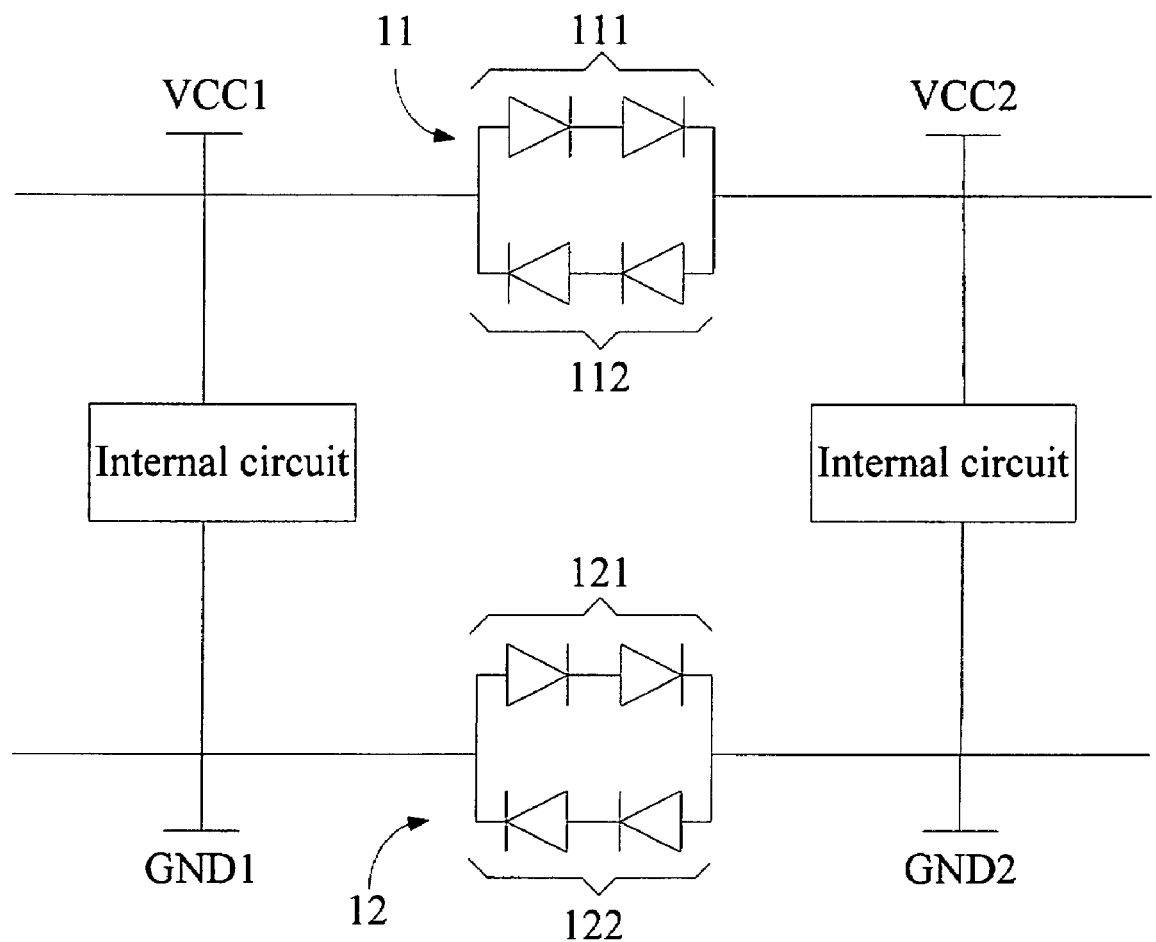
FIG. 1 is a conventional electrostatic discharge protection structure.
Figure 2:
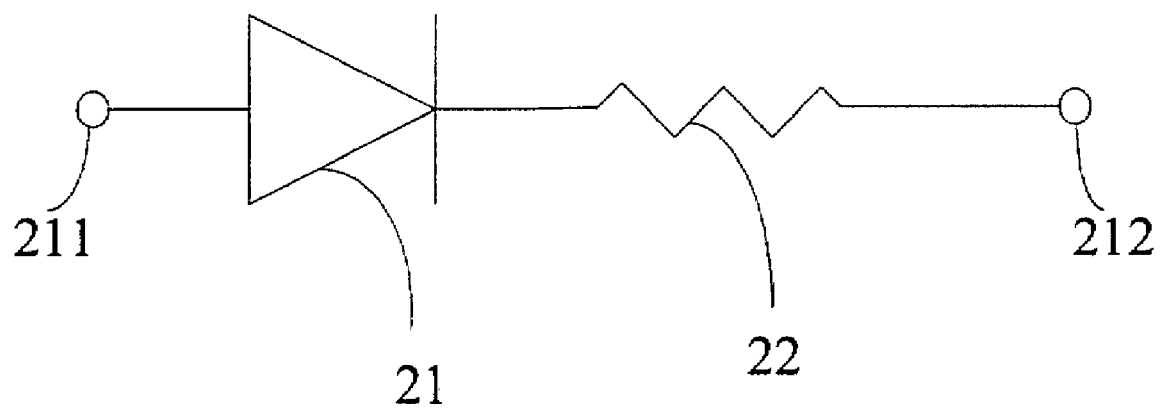
FIG. 2 is an equivalent model of a diode.
Figure 3:
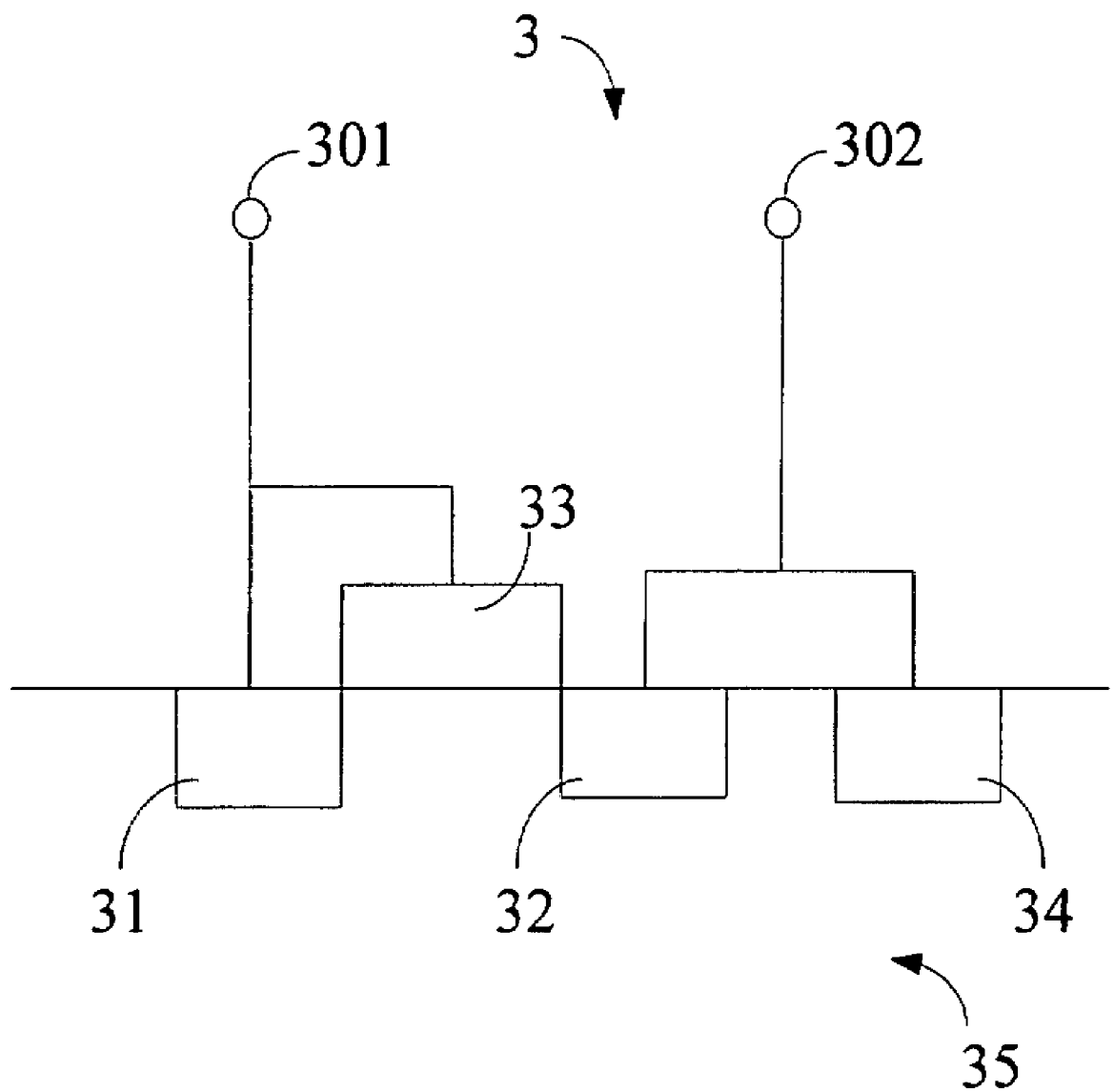
FIG. 3 is a first embodiment of the present invention.

FIG. 3 is a first embodiment of the present invention. An ESD protection device 3 is equivalent to an N-type MOS (NMOS) device, and comprises a drain 31 with N+ dopant, a source 32 with N+ dopant, a gate 33, a heavy doping region 34 with P+ dopant, a P-type substrate 35, a first end 301, and a second end 302. The symbol "+" means "heavy doping" herein. The drain 31, gate 33, and first end 301 are electrically connected. The source 32 and the heavy doping region 34 are electrically connected to form a body contact. The source 32 is also connected to the second end 302.

The first end 301 is adapted to connect to the ground GND1 of an internal circuit. Meanwhile the second end 302 is adapted to connect to the ground GND2 of another internal circuit. When a high voltage caused by ESD is present at the GND1, the high voltage is applied to the gate 33. The voltage difference of the gate 33 and the source 32 is then large enough to turn on the ESD protection device 3. When the ESD protection device 3 turns on, it acquires a low turn-on resistor; the ESD energy can thus, be transmitted from the GND1 to the GND2 via the ESD protection device 3.

Figure 4A:
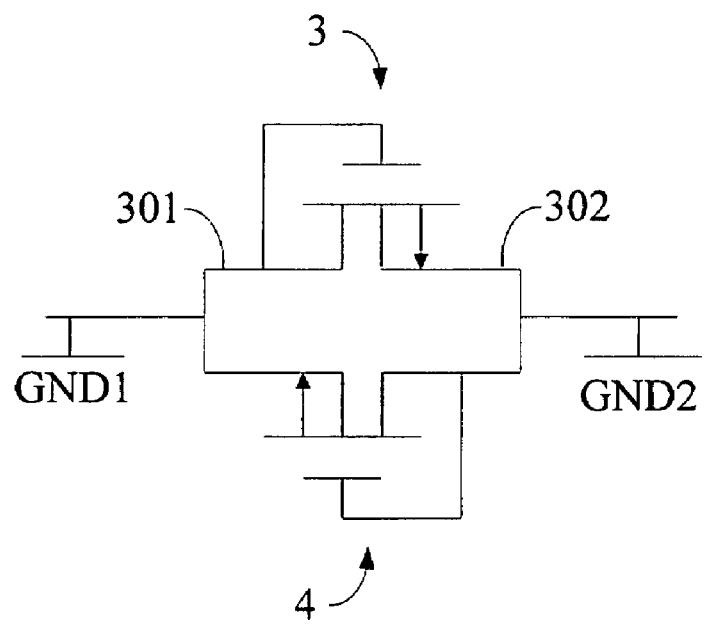
FIG. 4(a) is a second embodiment of the present invention.
Figure 4B:
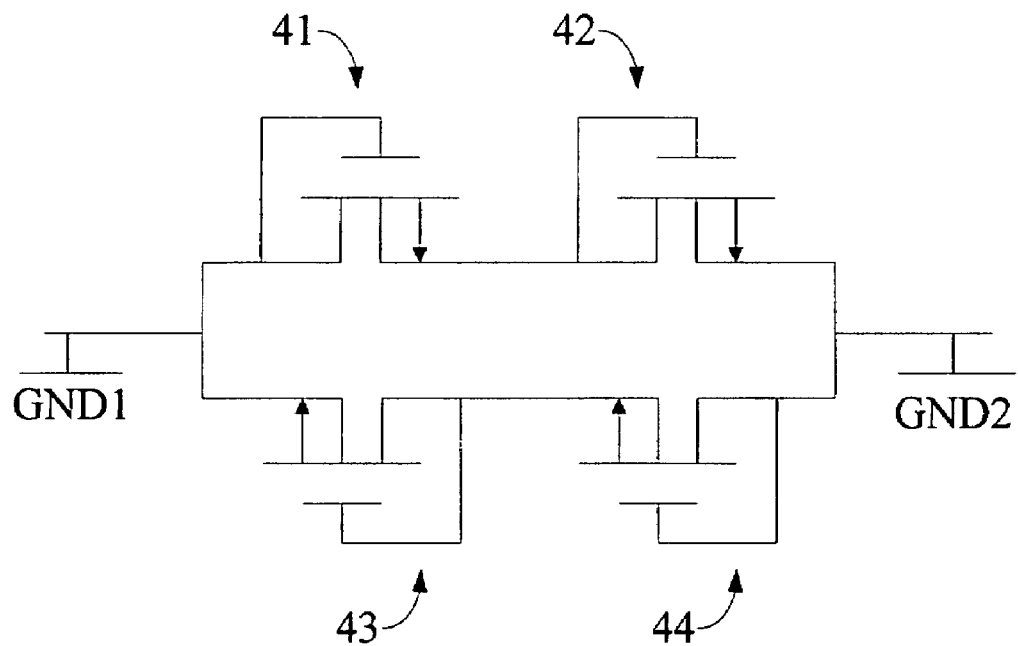
FIG. 4(b) is a third embodiment of the present invention.

A second embodiment of the present invention comprises a protection device 3 and a protection device 4 conducted in the opposite direction to prevent the ESD from communicating with the GND1 or GND2. The protection device 3 and the protection device 4 are in-parallel and connected to the GND1 and the GND2. FIG. 4(a) shows the second embodiment, wherein the protection device 3 comprises a first end 301 connecting to the GND1 and a second end 302 connecting to the GND2. A plurality of protection devices can be arranged in parallel to provide a larger threshold voltage and thus gain better noise-blocking capabilities. FIG. 4(b) shows a third embodiment of the present invention, wherein a protection device 41 is in-parallel with a protection device 42 to provide ESD protection, and another protection device 43 is in-parallel with its respective protection device 44.

Figure 5:
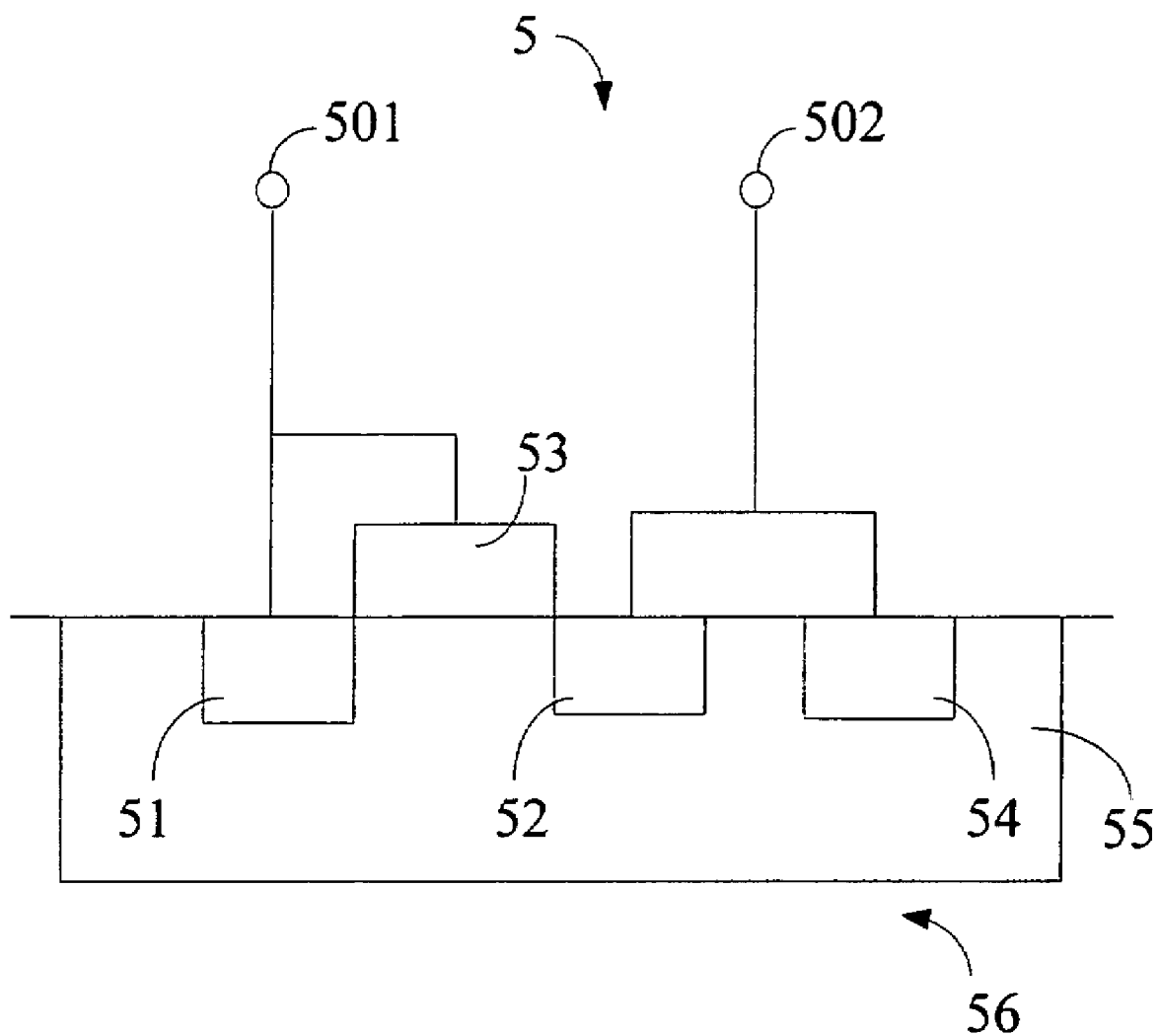
FIG. 5 is a fourth embodiment of the present invention.

FIG. 5 shows a fourth embodiment of the present invention. An ESD protection device 5 is equivalent to a P-type MOS (PMOS) device. The PMOS comprises a drain 51 with P+ dopant, a source 52 with P+ dopant, a gate 53, a heavy doping region with N+ dopant, a Nwell 55, a P substrate 56, a first end 501 and a second end 502. The Nwell 55 is adapted to a body of the PMOS. The drain 51, gate 53, and first end 501 are electrically connected together. The source 52 and the heavy doping region 54 are electrically connected to form a body contact. In addition, the source 32 connects to the second end 502. The Nwell 55 is equivalent to a substantial substrate, which means that when a PMOS is based on a P substrate, it needs to form an N well first to isolate the later formed drain and source from the P substrate.

Since the protection device 5 is within a P substrate, and the P substrate connects to the lowest voltage level of a chip, the first end 501 and the second end 502 are able to connect to power supply terminals VCC1 and VCC2, or to ground terminals GND1 and GND2.

Similarly, once the protection device is within an N substrate and formed with an NMOS, the protection device is able to connect to the power supply terminals or ground terminals. As a result, the device can be applied to a different substrate without substantially changing the protection. People skilled in the art can understand and practice the protection device within an N substrate by reviewing the aforementioned disclosure, thus, the same descriptions are omitted.

To outline the specifics of the present invention, this following example will address the connection of two power supply terminals VCC1 and VCC2 using the protection device 5, with the first end 501 connected to the VCC1, and the second end 502 connected to the VCC2. When there is a high voltage due to the presence of an ESD at the VCD2, the high voltage also carries through to the source 52. The voltage difference of the gate 53 and the source 52 is then large enough to turn on the ESD protection device 5. When the ESD protection device 5 turns on, it acquires a low turn-on resistor so that the ESD energy can be transmitted from the VCC2 to the VCC1 via the ESD protection device 5.

Similarly, the protection device 5 can join another protection device that is conducted in an opposite direction to prevent the ESD from being present at the VCC1 or VCC2. Also, a plurality of protection devices in-series can provide a better noise-blocking effect. People skilled in the art can understand and practice various combinations of protection devices by reviewing the aforementioned disclosure. Thus, the redundant descriptions are omitted.

The present invention is thus advantageous in providing an ESD protection device with a low internal resistor.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An electrostatic discharge protection device which is adapted to provide an electrostatic discharge path between two circuits, each having a power supply terminal and a ground terminal, the protection device comprising,
   an equivalent MOS having a source, a drain and a gate which connects to the drain;
   a first end connecting to the gate, and
   a second end connecting to the source;
   wherein the first end connects to one of the power supply terminal and the ground terminal of one of the circuits, and the second end connects to one of the power supply terminal and the ground terminal of the other circuit, the equivalent MOS is an NMOS within a P substrate, the first end connects to the ground terminal of one of the circuits, and the second end connects to the ground terminal of the other circuit.

2. An electrostatic discharge protection device which is adapted to provide an electrostatic discharge path between two circuits, each having a power supply terminal and a ground terminal, the protection device comprising:
   an equivalent MOS having a source, a drain and a gate which connects to the drain;
   a first end connecting to the gate, and
   a second end connecting to the source;
   wherein the first end connects to one of the power supply terminal and the ground terminal of one of the circuits, and the second end connects to one of the power supply terminal and the ground terminal of the other circuit, the equivalent MOS is a PMOS within an N substrate, the first end connects to the power supply terminal of one of the circuits, and the second end connects to the power supply terminal of the other circuit.

3. An electrostatic discharge protection device array which is adapted to provide an electrostatic discharge path between two circuits, comprising:

a plurality of equivalent MOSs in series, each having a source, a drain, and a gate, and the plurality of equivalent MOSs having a first equivalent MOS and a last equivalent MOS;

a first end connecting to a gate of the first equivalent MOS; and a second end connecting to a source of the last equivalent MOS;

wherein the drain of each of the MOSs connects to its gate, its source connects to a gate of a next MOS; the first end connects to one of a power supply terminal and a ground terminal of one of the circuits, and the second end connects to one of a power supply terminal and a ground terminal of the other circuit, each of the equivalent MOSs is an NMOS within a P substrate, the first end connects to the ground terminal of one of the circuits, and the second end connects to the ground terminal of the other circuit, respectively.

4. An electrostatic discharge protection device array which is adapted to provide an electrostatic discharge path between two circuits, comprising:

a plurality of equivalent MOSs in series, each having a source, a drain, and a gate, and the plurality of equivalent MOSs having a first equivalent MOS and a last equivalent MOS;

a first end connecting to a gate of the first equivalent MOS; and a second end connecting to a source of the last equivalent MOS;

wherein the drain of each of the MOSs connects to its gate, its source connects to a gate of a next MOS; the first end connects to one of a power supply terminal and a ground terminal of one of the circuits, and the second end connects to one of a power supply terminal and a ground terminal of the other circuit, each of the equivalent MOSs is a PMOS within an N substrate, the first end connects to the power supply terminal of one of the circuits, and the second end connects to the power supply terminal of the other circuit.

* * * * *